(12) United States Patent
Yamashita et al.

(10) Patent No.: US 7,619,896 B2
(45) Date of Patent: Nov. 17, 2009

(54) ELECTRICAL JUNCTION BOX

(75) Inventors: Hisanobu Yamashita, Yokkaichi (JP); Kunihiro Miyazaki, Yokkaichi (JP)

(73) Assignees: Autonetworks Technologies, Ltd., Mie (JP); Sumitomo Wiring Systems, Ltd., Mie (JP); Sumitomo Electric Industries, Ltd., Osaka (JP)

( * ) Notice: Subject to any disclaimer, the term of this patent is extended or adjusted under 35 U.S.C. 154(b) by 344 days.

(21) Appl. No.: 11/658,565

(22) PCT Filed: Jul. 26, 2005

(86) PCT No.: PCT/JP2005/013646

§ 371 (c)(1),
(2), (4) Date: Feb. 27, 2007

(87) PCT Pub. No.: WO2006/011478

PCT Pub. Date: Feb. 2, 2006

(65) Prior Publication Data

US 2008/0310121 A1 Dec. 18, 2008

(30) Foreign Application Priority Data

Jul. 27, 2004 (JP) ............................. 2004-219031

(51) Int. Cl.
*H05K 7/20* (2006.01)
(52) U.S. Cl. .................. 361/720; 361/611; 361/637; 361/648; 361/719; 439/76.1; 439/76.2; 165/80.3; 174/17 A; 174/17 R; 174/50; 174/52.1

(58) Field of Classification Search ................. 361/601, 361/622, 627, 641, 648–650, 690, 704, 707, 361/710, 715, 719–722, 823, 831–834; 174/17 R, 174/17 A, 50, 52.1, 52.4, 53, 54, 58, 59, 60, 174/66, 67, 77 R, 481, 520, 489; 439/76.1, 439/76.2, 190, 191, 535, 949; 307/9.1, 10.7, 307/10.8, 42; 257/718, 719; 165/80.3, 104.33, 165/185
See application file for complete search history.

(56) References Cited

U.S. PATENT DOCUMENTS 5,339,922 A * 8/1994 Beechler ...................... 182/188
(Continued)

FOREIGN PATENT DOCUMENTS

EP 0 744 885 A2 11/1996
(Continued)

*Primary Examiner*—Michael V Datskovskiy
(74) *Attorney, Agent, or Firm*—Oliff & Berridge, PLC

(57) ABSTRACT

The present invention improves heat dissipation of an electrical junction box. An electrical junction box includes a housing which houses a control circuit board disposed perpendicular to a power distribution board. The control circuit board includes a control circuit constructed on one side of an insulating substrate, electrical components mounted on the control circuit, and a heat dissipating means mounted on the other side. The power distribution board includes a plurality of bus bars laminated via a plurality of insulating layers. Consequently, heat generated by the electrical components can be dissipated efficiently by the heat dissipating means, thereby improving heat dissipation of the electrical junction box.

17 Claims, 5 Drawing Sheets

U.S. PATENT DOCUMENTS

| | | | |
|---|---|---|---|
| 5,655,927 A * | 8/1997 | Maue et al. | 439/510 |
| 5,866,850 A | 2/1999 | Kobayashi | |
| 6,116,916 A * | 9/2000 | Kasai | 439/76.2 |
| 6,430,054 B1 * | 8/2002 | Iwata | 361/752 |
| 6,514,091 B2 * | 2/2003 | Saito et al. | 439/76.2 |
| 6,515,226 B2 * | 2/2003 | Chiriku et al. | 174/50 |
| 6,522,528 B2 * | 2/2003 | Yamane | 361/601 |
| 6,541,700 B2 * | 4/2003 | Chiriku et al. | 174/50 |
| 6,600,658 B2 * | 7/2003 | Iwata | 361/752 |
| 6,602,079 B2 * | 8/2003 | Chiriku et al. | 439/76.2 |
| 6,605,780 B2 * | 8/2003 | Chiriku et al. | 174/60 |
| 6,610,926 B2 * | 8/2003 | Chiriku et al. | 174/60 |
| 6,611,066 B2 * | 8/2003 | Onizuka et al. | 307/9.1 |
| 6,693,370 B2 * | 2/2004 | Yamane et al. | 307/10.1 |
| 6,785,139 B2 * | 8/2004 | Onizuka et al. | 361/704 |
| 6,926,541 B2 * | 8/2005 | Takeuchi et al. | 439/76.2 |
| 6,948,950 B2 * | 9/2005 | Yamaguchi | 439/76.2 |
| 7,099,155 B2 * | 8/2006 | Kobayashi et al. | 361/719 |
| 7,137,829 B2 * | 11/2006 | Onizuka et al. | 439/76.2 |
| 7,283,366 B2 * | 10/2007 | Yamashita | 361/719 |

FOREIGN PATENT DOCUMENTS

| | | |
|---|---|---|
| JP | U 63-63988 | 4/1988 |
| JP | U 04-061417 | 5/1992 |
| JP | A 8-322127 | 12/1996 |
| JP | A 11-285132 | 10/1999 |
| JP | 0200008331 A * | 3/2000 |
| JP | A 2002-171640 | 6/2002 |
| JP | 02002330525 A * | 11/2002 |
| JP | A 2002-330526 | 11/2002 |
| JP | A 2003-079027 | 3/2003 |
| JP | A 2003-164039 | 6/2003 |
| JP | A 2003-164040 | 6/2003 |
| JP | A 2003-243834 | 8/2003 |
| JP | A 2003-324823 | 11/2003 |
| JP | A 2004-040873 | 2/2004 |

* cited by examiner

ELECTRICAL JUNCTION BOX

TECHNICAL FIELD

The present invention relates to an electrical junction box consisting of a housing which houses electrical components.

BACKGROUND ART

Known electrical junction boxes of this type include, for example, the type disclosed in Japanese Patent Laid-Open No. 8-322127. The electrical junction box consists of a housing which houses a power distribution board composed of a plurality of bus bars disposed along insulating substrates, where electrical components such as relays to be connected to the power distribution board are arranged and mounted on the upper surface of the housing.

With the above configuration, however, the electrical components such as relays generate heat when conducting electricity. The heat emitted from adjacent electrical components does not dissipate sufficiently and may build up gradually. The heat buildup may cause problems such as deformation of parts and the like, and thus it is desirable to dissipate the heat out of the electrical junction box quickly.

SUMMARY OF THE INVENTION

The present invention has been made in view of the above circumstances and has an object to improve heat dissipation of an electrical junction box.

To achieve the above object, the present invention provides An electrical junction box characterized by comprising: a housing, wherein the housing includes housing electrical components; a power distribution board composed of a first plurality of bus bars disposed along a first insulating substrate, wherein the power distribution board is positioned in the housing, further wherein the power distributing board is connectable to the housing electrical components; a control circuit board installed in the housing in such a way as to be perpendicular to the power distribution board, the control circuit board including an electronic circuit constructed on a second insulating substrate; control circuit electrical components mounted on a first side of the control circuit board and controlled by the electronic circuit; a bus bar circuit including a second plurality of bus bars and bonded, via a first insulative bonding layer, to a second side of the control circuit board; and heat dissipating means which is bonded to a second insulative bonding layer, to dissipate heat from the control circuit board, wherein the second insulative bonding layer is bonded to the second side of the control circuit board.

The following configurations are preferable for implementations of the invention:

(1) Bus bars of the bus bar circuit can be bonded to the control circuit board and can have tips bent perpendicular to a body of the control circuit board, and have tab pieces formed at the tips to connect to the power distribution board. The tab pieces formed at the tips of the bus bars face in the direction perpendicular to the control circuit board. Consequently, when connecting the control circuit board to the electrical junction box by inserting the tab pieces into, for example, female fittings disposed in the electrical junction box, even if the tab pieces are flexurally deformed in the direction perpendicular to their body by coming into contact with the female fittings, since the flexural deformation is stopped by the perpendicularly bent portion, no force perpendicular to the body of the bus bars will be applied to the bus bars mounted on the control circuit board. This prevents the heat dissipating means and control circuit board from separating from the bus bars when connecting the control circuit board to the electrical junction box.

(2) The bus bars installed along the power distribution board have tab pieces which, extending toward the control circuit board, are connected with the tab pieces on the control circuit board via female relay terminals or by welding. The bus bars disposed on the power distribution board can be produced by punching a metal plate and tab pieces can be produced easily by tapering tips of the bus bars. Similarly, tab pieces can be produced easily on the bus bars bonded to the control circuit board by tapering their tips. The control circuit board and power distribution board can be connected when the tab pieces thus produced easily are connected with each other by welding or by a simple method of insertion into female relay terminals. Thus, the present invention makes it possible to generally simplify the process of connecting the control circuit board and power distribution board.

(3) The control circuit board has a mounting surface on which the electrical components are mounted; the mounting surface faces the power distribution board; and the heat dissipating means faces in a direction opposite to the power distribution board. Since the mounting surface of the control circuit board faces the power distribution board and the heat dissipating means faces in the direction opposite to the power distribution board, the heat from the heat dissipating means can be dissipated efficiently. This makes it possible to improve the heat dissipation of the electrical junction box.

(4) a plurality of the electrical components are mounted on the control circuit board which have ends, being located away from each other near the ends of the control circuit board. The plurality of electrical components mounted on the control circuit board are located away from each other near the ends of the control circuit board. This prevents the control circuit board from becoming hot locally due to concentration of heat generating parts.

(5) The electrical components on the control circuit board can be semiconductor relays. Generally, semiconductor relays generate larger amounts of heat than mechanical relays, fuses, and the like. Also, generally semiconductor relays are mounted by soldering and have an upper limit on ambient operating temperature set at a lower level than mechanical relays which are connected by means of connectors. Thus, higher heat dissipation is required of the semiconductor relays. By mounting the semiconductor relays on the control circuit board and installing the heat dissipating means on the control circuit board so as to decrease the distance between the semiconductor relays and heat dissipating means, it is possible to efficiently dissipate the heat generated from the semiconductor relays. This makes it possible to improve the heat dissipation of the electrical junction box.

(6) The power distribution board has ends; and the control circuit board is located at an end of the power distribution board and extends on one side of the power distribution board, thereby forming a L shape. Since electrical components such as relays to be connected to the power distribution board are disposed in the housing, a predetermined part of the space extending in a direction orthogonal to the power distribution board is occupied by the electrical components. With this configuration, the control circuit board is located at an end of the power distribution board and forms a L shape in conjunction with the power distribution board by extending on one side of the power distribution board on which the electrical components are mounted. Consequently the control circuit board can be positioned by utilizing that part of the space extending in the direction orthogonal to the power distribution board which is primarily occupied by the electrical components. This makes it possible to increase the space efficiency of the electrical junction box.

(7) An auxiliary housing is installed integrally with the housing, being open on the side opposite to the power distribution board, to house the control circuit board. Since the auxiliary housing is formed integrally with the housing of the electrical junction box, it is possible to reduce the size of the housing as a whole compared to when they are formed separately. Since the control circuit board can be assembled from the open side of the auxiliary housing, it is easy to assemble the control circuit board onto the electrical junction box.

(8) The heat dissipating means can be a heat dissipating plate installed on the open side of the auxiliary housing. Since the heat dissipating plate installed on the control circuit board is located on the open side of the auxiliary housing, the heat generated by the electrical components mounted on the control circuit board can be dissipated efficiently out of the electrical junction box while protecting the entire electrical junction box by enclosing it in the housing. This makes it possible to improve the heat dissipation of the electrical junction box.

(9) The housing can be set such that electrical components will be mounted on front and rear faces of the power distribution board; and height of the auxiliary housing in a direction orthogonal to the power distribution board can be set to fall within a range equal to width between maximum height of the electrical components mounted on the front face of the housing and maximum height of the electrical components mounted on the rear face of the housing. Since electrical components are disposed on the front and rear faces of the power distribution board in the housing, that part of the space extending in the direction orthogonal to the power distribution board which is defined by the width between the maximum height of the electrical components mounted on the front face of the housing and the maximum height of the electrical components mounted on the rear face of the housing is occupied by the electrical junction box. With this configuration, the auxiliary housing is formed in the space occupied by the electrical junction box in which the electrical components are mounted. Since the control circuit board can be positioned in the space primarily occupied by the electrical junction box as the control circuit board is housed in the auxiliary housing, it is possible to increase the space efficiency of the electrical junction box.

According to the invention, since the control circuit board can be disposed perpendicular to the power distribution board, electrical components can be mounted in the electrical junction box without increasing a projected area in the direction perpendicular to a body of the power distribution board. This makes it possible to increase space efficiency of the electrical junction box.

Also, since electrical components can be installed on the control circuit board separate from the power distribution board and the heat dissipating means is installed on the control circuit board, heat emitted from the electrical components on the control circuit board is dissipated efficiently outside by the heat dissipating means. This improves heat dissipation of the electrical junction box.

Also, by installing the electrical components on the control circuit board, it is possible to reduce the amount of heat generated on the power distribution board. This reduces or prevents the power distribution board from becoming hot locally.

Figure 1:
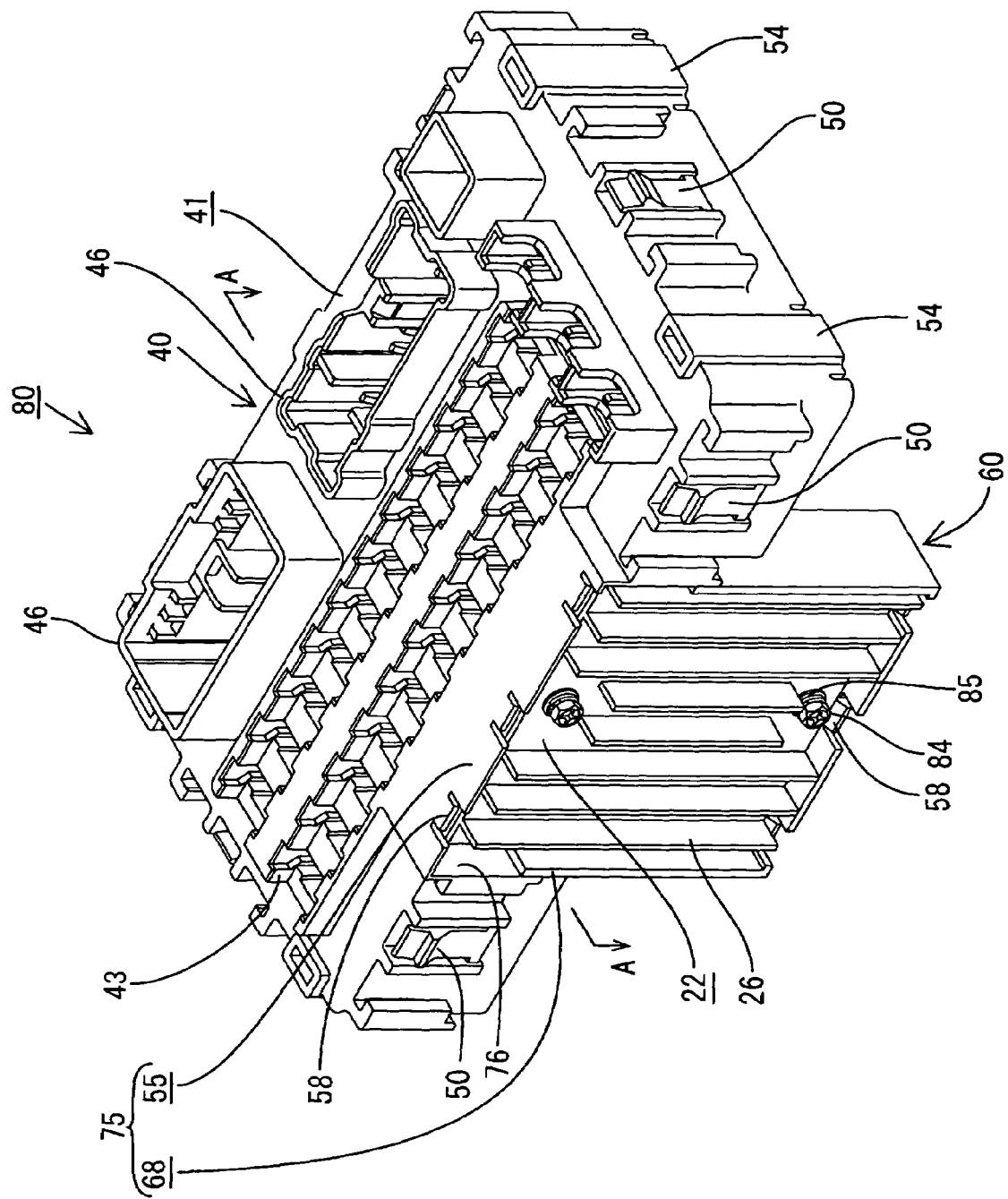
FIG. 1 is a perspective view of an electrical junction box according to the exemplary structure.

DESCRIPTION OF SYMBOLS 10 busbar
11 insulating plate (insulating substrate)
12 power distribution board
14 power-distribution-side tab piece
20 insulating substrate (insulating substrate different from the insulating substrates of the power distribution board)
21 control circuit board
22 heat dissipating plate
24 semiconductor relay
25 control-side tab piece
30 female relay terminal
40 housing
75 auxiliary housing
80 electrical junction box
86 fuse

DETAILED DESCRIPTION OF THE PRESENT INVENTION

An exemplary structure of the present invention will be described with reference to FIGS. 1 to 5.

Figure 4:
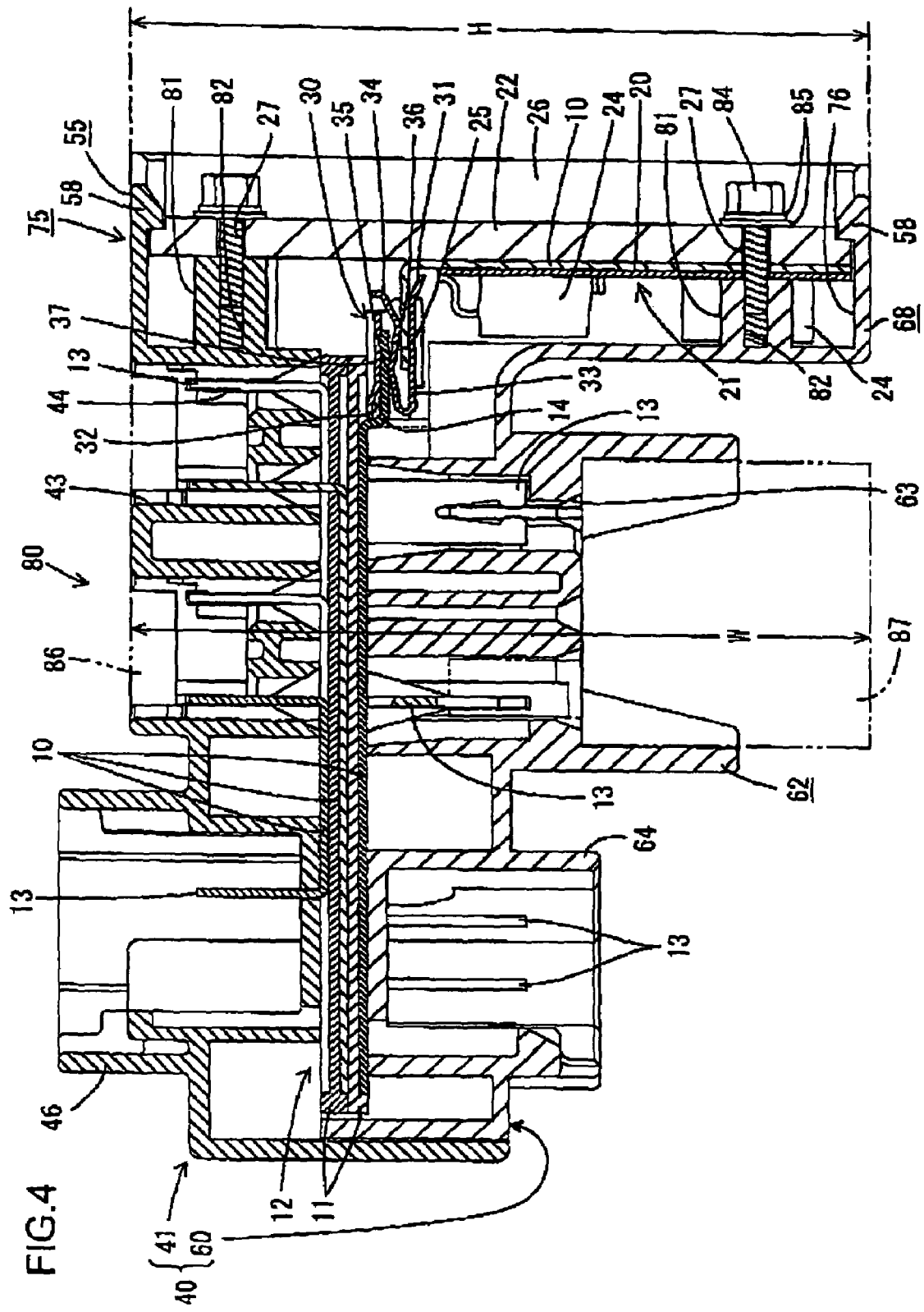
FIG. 4 is a sectional view taken along line A-A in FIGS. 1 and 3.

An electrical junction box 80 according to the exemplary structure consists of a flat housing 40 which houses a power distribution board 12 with its body facing in the up-and-down direction (see FIG. 4). The housing 40 is made of a synthetic resin. It consists of a lower casing 60 and upper casing 41 joined together, where the lower casing 60 has an open top, which is covered by the upper casing 41.

Figure 3:
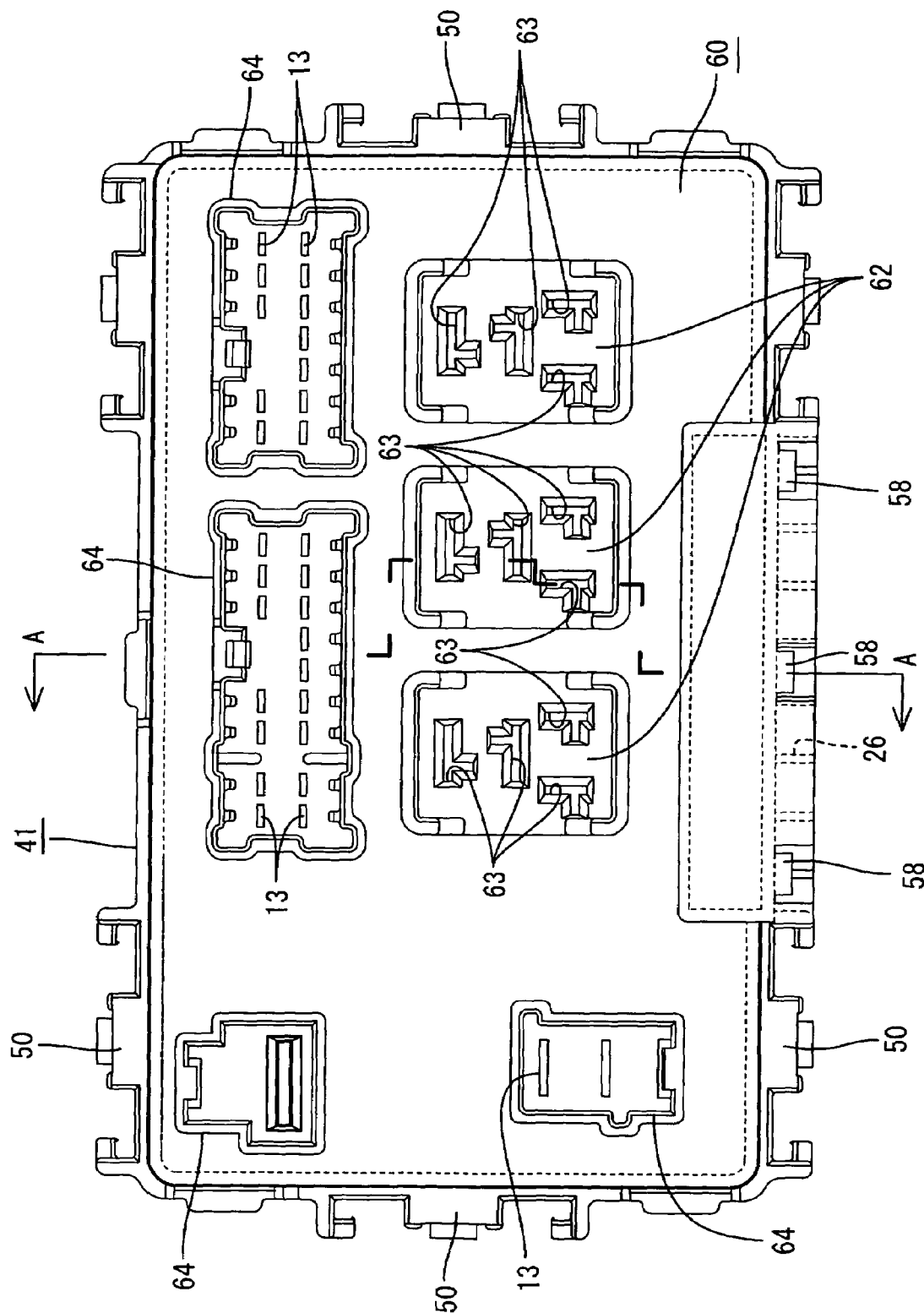
FIG. 3 is a bottom view of the electrical junction box according to the exemplary structure.

As shown in FIGS. 3 and 4, on a lower wall of the lower casing 60, there are a relay mount 62 recessed to mount a relay 87 and a connector hood 64 used to connect a wire harness (not shown). Relay terminal insertion slots 63, which vertically penetrate the lower wall of the lower casing 60, are formed in the relay mount 62 to accept power distribution terminals 13 (described later). The power distribution terminals 13 (described later) penetrate a bottom wall of the connector hood 64, protruding into the connector hood 64.

Figure 2:
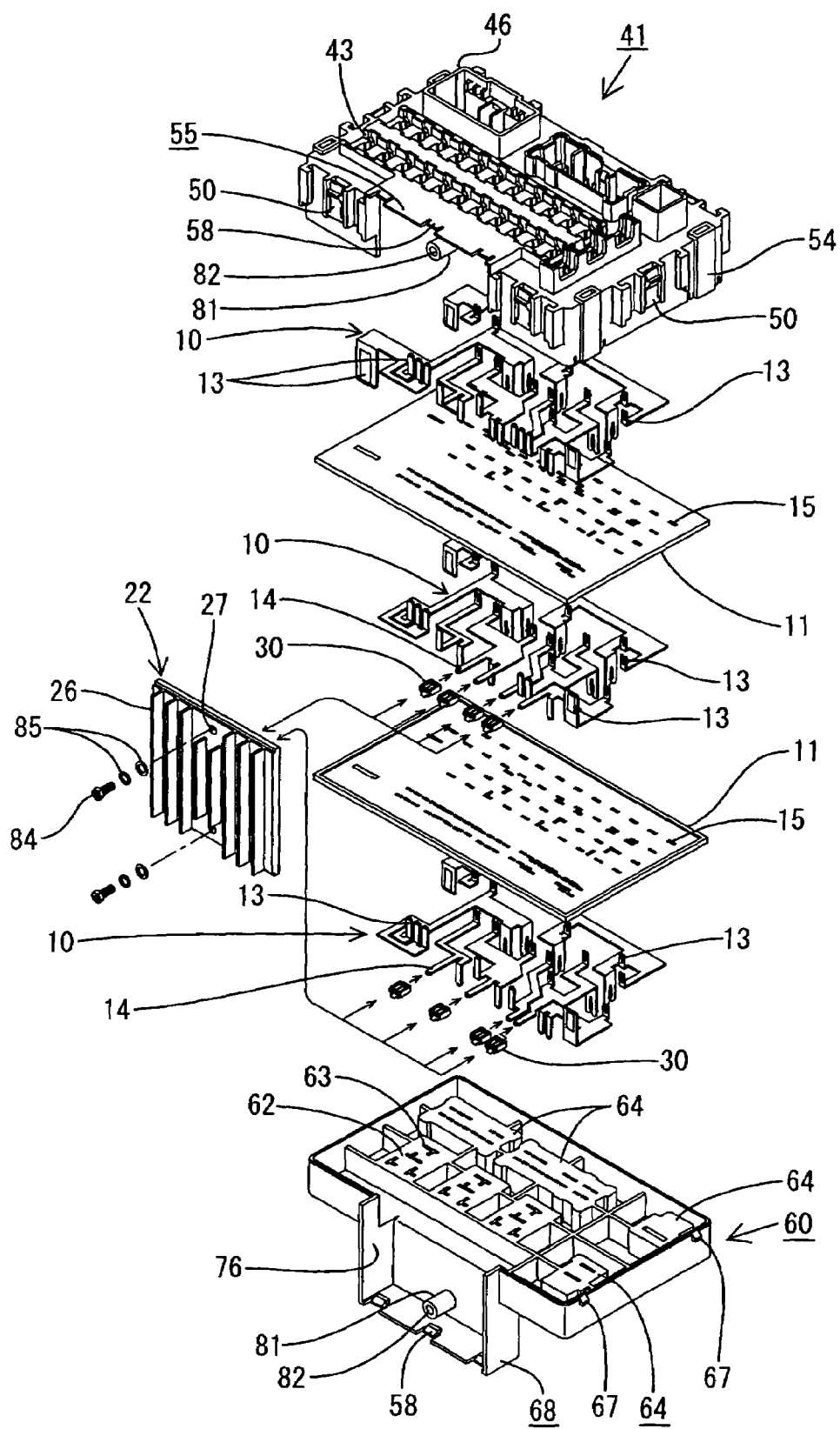
FIG. 2 is an exploded perspective view of the electrical junction box according to the exemplary structure.

As shown in FIG. 2, the lower casing 60 is approximately rectangular in shape when viewed from above. Lock tongues 67 are formed on outer surfaces of side walls at both longitudinal ends of the lower casing 60 to fasten the lower casing 60 and upper casing 41 by latching onto lock strikes 54 described later.

As shown in FIGS. 1 and 4, on an upper wall of the upper casing 41, there are a fuse mount 43 recessed to mount a fuse 86 and a connector hood 46 used to connect a wire harness (not shown). Fuse terminal insertion slots 44, which penetrate the upper wall of the upper casing 41 vertically, are formed in the fuse mount 43 to accept the power distribution terminals 13 (described later). The power distribution terminals 13 (described later) penetrate a bottom wall of the connector hood 46, protruding into the connector hood 46.

As shown in FIG. 1, the upper casing 41 is approximately rectangular in shape when viewed from above. To fasten the housing 40 (for example, to a vehicle body which is not shown), lances 50 are formed on outer surfaces of two shorter side walls of the upper casing 41 as well as near longitudinal ends of outer surfaces of two longer side walls of the upper casing 41.

As shown in FIG. 1, on lower ends of the outer surfaces of the two shorter side walls of the upper casing 41, lock strikes 54 are formed at positions which correspond to the lock tongues 67 on the lower casing 60 to fasten the upper casing 41 and lower casing 60 by being latched onto by the lock tongues 67.

The upper casing 41 and lower casing 60 are integrated into one piece as the upper casing 41 is assembled onto the lower casing 60 from above and the lock strikes 54 are latched onto by the lock tongues 67.

The power distribution board 12 includes a laminate of multiple layers (three layers according to the exemplary structure) of multiple bus bars 10 (which can be produced by punching a metal plate), with an insulating plate 11 interposed between every layer. Predetermined ones of the bus bars 10 have their ends bent upward or downward to constitute the power distribution terminals 13. The ends other than the power distribution terminals 13 are bent downward once, bent in such a way as to protrude to the left front side in FIG. 2, and slightly tapered at the tip to form power-distribution-side tab pieces 14 for connection with a control circuit board 21.

The insulating plates 11 are approximately rectangular in shape. A plurality of passage holes 15 for use to insert the power distribution terminals 13 are formed at predetermined positions in their bodies, passing through them vertically.

Above the upper surface of the power distribution board 12, the power distribution terminals 13 protrude upward from the passage holes 15. Below the undersurface of the power distribution board 12, the power distribution terminals 13 protrude downward from the passage holes 15. The power-distribution-side tab pieces 14 protrude from the left front end of the power distribution board 12 in FIG. 2, being arranged in the same plane.

As shown in FIG. 4, the control circuit board 21 is positioned at an end of the power distribution board 12. The control circuit board 21 consists of a control circuit formed on one surface of an insulating substrate 20 by printed wiring means, and two semiconductor relays 24 mounted on the control circuit. Bus bars 10, in electrical connection with the control circuit, are laid along a surface opposite to the parts mounting surface. Incidentally, to increase heat dissipation, openings may be provided in the insulating substrate 20 and some terminals of the semiconductor relays 24 may be soldered directly to the bus bars 10 through the openings, thereby allowing the heat generated in the semiconductor relays 24 to be transmitted to the bus bars 10.

As shown in FIG. 4, the semiconductor relays 24 are located away from each other one of them can be located near the upper end of the control circuit board 21 while the other is located near the lower end of the control circuit board 21. Incidentally, the bus bars 10 are pasted integrally to the insulating substrate 20 via a thin bonding sheet or adhesive layer (not shown) which has insulating properties. Predetermined bus bars in the group of bus bars 10 are extended in a direction parallel to the body of the control circuit board 21, formed by bending in such a way as to protrude toward the parts mounting surface, and slightly tapered at the tip to form control-side tab pieces 25 for connection with the power distribution board 12. The control-side tab pieces 25 can be arranged in the same plane.

As shown in FIG. 4, the power distribution board 12 and control circuit board 21 are electrically connected when the power-distribution-side tab pieces 14 and control-side tab pieces 25 are inserted into female relay terminals 30.

Figure 5:
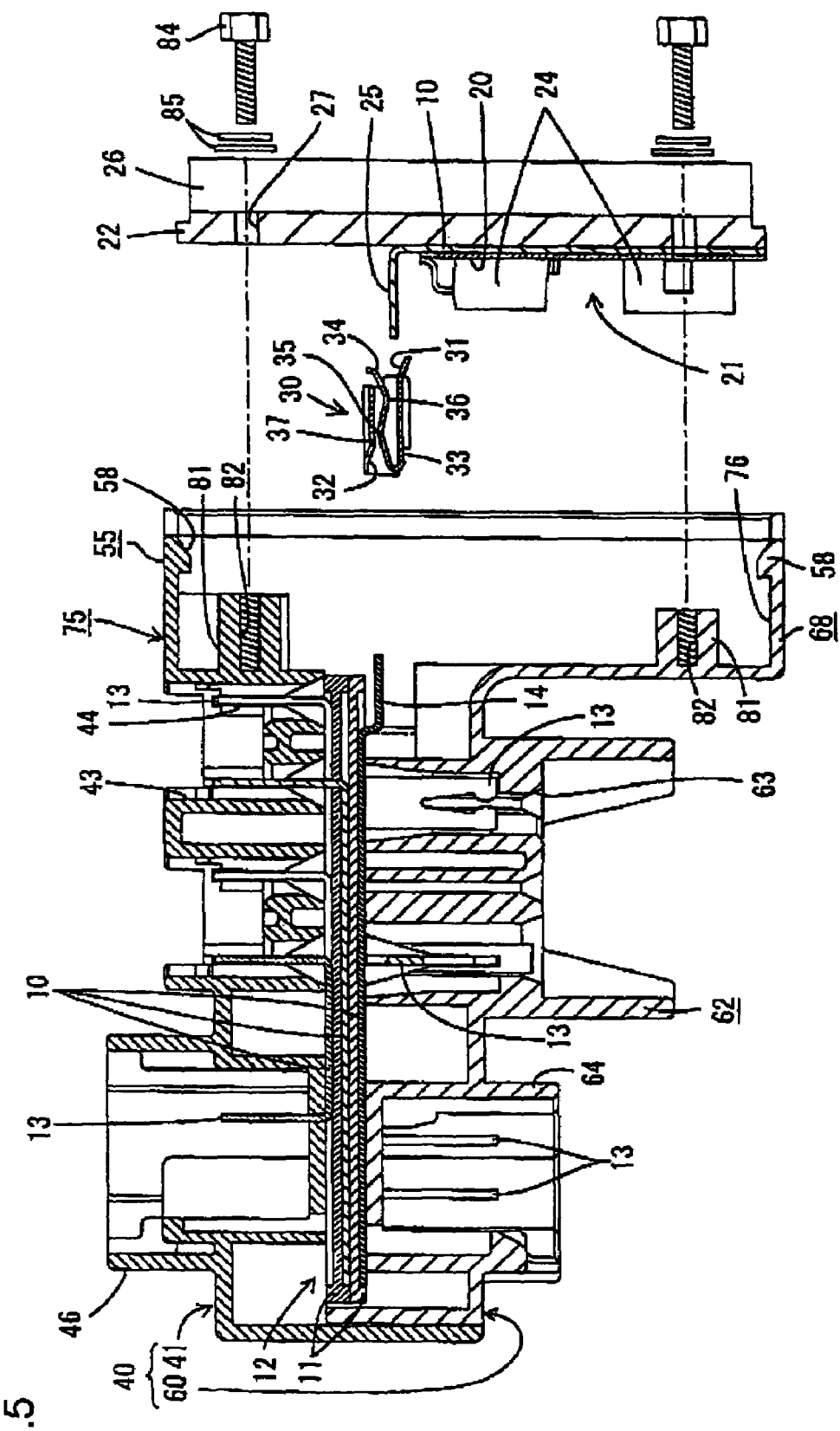
FIG. 5 is a sectional view taken along line A-A in FIGS. 1 and 3 before assembly of the electrical junction box.

As shown in FIG. 5, each of the female relay terminals 30 has an approximately rectangular parallelepiped shape, which is formed by bending from a conductive metal plate punched on a press. The female relay terminal 30 has a control-side tab piece insertion slot 31 on the right side in FIG. 5 to accept the control-side tab piece 25. On the left side in FIG. 5, a power-distribution-side tab piece insertion slot 32 is included to accept the power-distribution-side tab piece 14.

An elastic contact piece 34 is extended from the left side of a lower wall 33 of the female relay terminal 30 in FIG. 5 and folded back to the right in FIG. 5. The elastic contact piece 34 is bent twice in such a way as to look like the letter S when viewed from the side.

The undersurface of that part of the elastic contact piece 34 which forms a projection curved downward when viewed from side constitutes a control-side contact 36 for connection with the control-side tab piece 25. The upper surface of that part of the elastic contact piece 34 which forms a projection curved upward when viewed from side constitutes a power-distribution-side contact 35 for connection with the power-distribution-side tab piece 14. An upper wall of the female relay terminal 30 can be sunken, forming a catch 37 for contact with the power-distribution-side tab piece 14.

As shown in FIG. 4, when inserted in the power-distribution-side tab piece insertion slot 32 from the left in FIG. 4, the power-distribution-side tab piece 14 comes into contact with the power-distribution-side contact 35 and presses the elastic contact piece 34 downward. Consequently, the elastic contact piece 34 is deformed flexurally, and restoring elastic force causes the power-distribution-side tab piece 14 to be pinched between the catch 37 and elastic contact piece 34.

Also, the control-side tab piece 25 inserted into the control-side tab piece insertion slot 31 from the right in FIG. 4 comes into contact with the control-side contact 36, and thereby presses the elastic contact piece 34 upward. Consequently, the elastic contact piece 34 is deformed flexurally, and restoring elastic force causes the control-side tab piece 25 to be pinched between the lower wall 33 of the female relay terminal 30 and elastic contact piece 34.

A heat dissipating plate 22 for use to dissipate the heat generated from the semiconductor relays 24 is bonded via an insulative bonding layer (not shown) to the bus bars 10 pasted to the control circuit board 21. The heat dissipating plate 22, approximately rectangular in shape, is made of an aluminum or other metal plate with high thermal conductivity. It is equipped with multiple columns of fins 26. Also, it has mounting passage holes 27 near the upper and lower ends.

A box-shaped lower-casing-side auxiliary housing 68 open to the left front side in FIG. 2, and capable of housing the control circuit board 21, is formed on a left front side wall of the lower casing 60 in FIG. 2. A pawl 58, capable of elastic deformation, protrudes upward from the left front end of a lower wall of the lower-casing-side auxiliary housing 68 in FIG. 2.

A cylindrical boss 81 for use to screw the control circuit board 21 is formed near the lower end of the lower-casing-side auxiliary housing 68, protruding to the left front side in FIG. 2. A threaded hole 82 is provided at a tip of the boss 81.

An upper-casing-side auxiliary housing 55 open to the left front side in FIG. 2, and capable of housing the control circuit board 21, is formed on a left front side wall of the upper casing 41 in FIG. 2.

A pawl 58, capable of elastic deformation, hangs down from the left front end of an upper wall of the upper-casing-side auxiliary housing 55 in FIG. 2.

A cylindrical boss 81 for use to screw the control circuit board 21, is formed on the upper-casing-side auxiliary housing 55, protruding to the left front side in FIG. 2. A threaded hole 82 is provided at a tip of the boss 81.

When the upper casing 41 and lower casing 60 are integrated into one piece, an auxiliary housing 75 formed by integrating the upper-casing-side auxiliary housing 55 and lower-casing-side auxiliary housing 68 into one piece is provided on the left front side of the housing 40 in FIG. 1, with an opening 76 facing the left front side in FIG. 1.

As shown in FIG. 4, vertical height H of the auxiliary housing 75 is set such as to fit in (be approximately equal to) dimension W between top of the fuse 86 mounted in the fuse mount 43 and top of the relay 87 mounted in the relay mount 62.

As shown in FIG. 4, the control circuit board 21 is assembled to the opening 76 of the auxiliary housing 75 from the open side in such a way that it will be perpendicular to the power distribution board 12 and that the heat dissipating plate 22 will be exposed outside the housing 40. The control circuit board 21 is located at an end of the power distribution board 12 and extends on one side of the power distribution board 12, forming a L shape. Upper and lower edges of the heat dissipating plate 22 are kept from falling off by being hooked by the pawls 58. Screws 84 are inserted into the mounting passage holes 27 of the heat dissipating plate 22 via washers 85 and screwed with the threaded hole 82. Consequently, the control circuit board 21 is fastened to the auxiliary housing 75.

Next, operation and advantages of the exemplary structure will be described.

According to the exemplary structure, since the control circuit board 21 is disposed perpendicular to the power distribution board 12, the semiconductor relays 24 can be mounted in the electrical junction box 80 without increasing a projected area in the direction perpendicular to the body of the power distribution board 12. This makes it possible to increase the space efficiency of the electrical junction box 80.

In the housing 40, since the relay 87 and fuse 86 are disposed on the front and rear faces of the power distribution board 12, that part of the space extending in the direction orthogonal to the power distribution board 12 which is defined by the dimension W between the top of the fuse 86 mounted in the fuse mount 43 and top of the relay 87 mounted in the relay mount 62 is occupied by the electrical junction box. According to the exemplary structure, the control circuit board 21 is located at an end of the power distribution board 12 and extends on one side of the power distribution board 12, forming the letter L, the vertical height H of the auxiliary housing 75 is set such as to fit in (be approximately equal to) the dimension W, and the control circuit board 21 is housed in the auxiliary housing 75. Consequently, the control circuit board 21 can be positioned in the space primarily occupied by the electrical junction box 80, making it possible to increase the space efficiency of the electrical junction box 80.

The increase in space efficiency of the electrical junction box 80 may also increase packaging density of the relay 87, fuse 86, semiconductor relays 24, and the like housed in the electrical junction box 80. Consequently, there is concern that the heat emitted from the electrical components may result in local heat buildup.

To deal with this, according to the exemplary structure, the control circuit board 21 is installed apart from the power distribution board 12 on which the relay 87 and fuse 86 are mounted, semiconductor relays 24 which generate large amounts of heat are installed on the control circuit board 21, and the heat dissipating plate 22 is installed on the control circuit board 21. Consequently, the heat from the semiconductor relays 24 is dissipated quickly from the heat dissipating plate 22, making it possible to improve the heat dissipation of the electrical junction box. Also, the two semiconductor relays 24 mounted on the control circuit board 21 are disposed away from each other near the end of the upper or lower end of the control circuit board 21. This prevents the control circuit board 21 from becoming hot locally due to concentration of heat generating parts.

Also, since the amount of heat generated on the power distribution board 12 can be reduced by mounting the semiconductor relays 24 on the control circuit board 21, it is also possible to prevent the power distribution board 12 from becoming hot locally.

Also, according to the exemplary structure, since the control circuit board 21 is mounted on the opening 76 of the auxiliary housing 75 from the open side, there is no member which would obstruct assembly operation. This makes it easy to house the control circuit board 21 in the auxiliary housing 75. Also, since the control circuit board 21 is connected to the power distribution board 12 simply by inserting the power-distribution-side tab pieces 14 and control-side tab pieces 25 (formed on ends of the bus bars 10) into the female relay terminals 30, it is possible to simplify the entire process of assembling the control circuit board 21 onto the electrical junction box 80.

When the control-side tab piece 25, protruding from the control circuit board 21 perpendicularly to the body of the control circuit board 21, is inserted into the control-side tab piece insertion slot 31 in the female relay terminal 30 from the right side in FIG. 5, the control-side tab piece 25 abuts the control-side contact 36 from the right side in FIG. 5. Consequently, the control-side tab piece 25 may become flexurally deformed in a direction perpendicular to its body. However, since the bus bar 10 on which the control-side tab piece 25 is formed by bending perpendicularly to the body of the control circuit board 21, the flexural deformation of the control-side tab piece 25 is absorbed by the portion bent perpendicularly. This makes it possible to reduce or prevent the bus bars 10 from flexurally deforming in the direction perpendicular to their body. This in turn makes it possible to prevent the heat dissipating plate 22 and control circuit board 21 from separating from the bus bars 10.

<Other Exemplary Structures>

The present invention is not limited to the exemplary structure described above with reference to the drawings. Exemplary structures such as described below are also included in the scope of the present invention.

(1) Although two semiconductor relays 24 are mounted on the control circuit board 21 in the above exemplary structure, the present invention is not limited to this and one or more than two semiconductor relays 24 may be mounted.

(2) Although the heat dissipating plate 22 is installed on the control circuit board 21 in the above exemplary structure, the present invention is not limited to this install. The heat dissipating plate 22 may be omitted as long as the heat emitted from the semiconductor relays 24 mounted on the control circuit board 21 is dissipated efficiently. Also, other heat dissipating means such as heat pipes may be installed instead of the heat dissipating plate 22.

(3) Although the two semiconductor relays 24 are installed near the respective ends of the control circuit board 21 in the above exemplary structure, the present invention is not limited to this. For example, when mounting electrical components which generate reduced amounts of heat on the control circuit board 21, it is not likely that the heat emitted from the electrical components may build up locally, and thus the electrical components may be mounted near the center of the control circuit board 21.

(4) Although the semiconductor relays 24 are mounted on the control circuit board 21 in the above exemplary structure, the present invention is not limited to this and semiconductor relays 24 may be mounted on the power distribution board 12. Alternatively, other heat generating parts such as mechanical relays and resistors may be mounted on the control circuit board 21. Also, any type of semiconductor relays 24 may be used regardless of the outer shape; shape of terminals; connection method which may employ connectors, soldering, or the like; presence or absence of a control circuit or troubleshooting circuit; etc. They may be stand-alone semiconductors such as FETs, bipolar transistors, SCRs, or the like as long as they can make and break electrical connections in response to control signals.

(5) Although the power distribution board 12 is composed of a plurality of bus bars 10 laminated in three layers via the insulating plates 11 in the above exemplary structure, the present invention is not limited to this and the power distribution board 12 may be composed of one layer. Alternatively, it may be composed of two layers or more than three layers of bus bars 10 laminated via insulating plates 11.

(6) Although the power distribution board 12 is constructed by laminating the bus bars 10 and insulating plates 11 in such a way that their bodies will be parallel to each other in the above exemplary structure, the present invention is not limited to this and the insulating plates 11 and bus bars 10 may be disposed in such a way that their bodies will be perpendicular to each other and that the bodies of the insulating plates 11 will be in contact with the bus bars 10.

(7) Although the auxiliary housing 75 is formed integrally with the housing 40 of the electrical junction box 80 in the above exemplary structure, the present invention is not limited to this and the auxiliary housing 75 may be formed separately and then mounted on the housing 40 of the electrical junction box 80.

(8) Although the vertical height H of the auxiliary housing 75 is set approximately equal to the dimension W between the top of the fuse 86 mounted in the fuse mount 43 and top of the relay 87 mounted in the relay mount 62 in the above exemplary structure, the present invention is not limited to this and the dimension H may be set smaller than the dimension W. On the other hand, if enough space is available in the direction orthogonal to the power distribution board 12 to install the auxiliary housing 75, the dimension H may be set larger than the dimension W.

(9) Although in the above exemplary structure, the control-side tab pieces 25 are formed on the tips of the bus bars 10 (bonded to the control circuit board 21), where the tips are bent perpendicular to the body of the control circuit board 21, the present invention is not limited to this and the control-side tab pieces 25 may be formed on the tips of the bus bars 10 extending in parallel to the control circuit board 21.

In that case, the power-distribution-side tab pieces 14 may be formed at the tips of the bus bars 10 of the power distribution board 12 by bending the tips perpendicularly to the body of the power distribution board 12, and the control-side tab pieces 25 and power-distribution-side tab pieces 14 thus formed may be connected via female relay terminals 30 or by welding.

Furthermore, in that case, flexural deformation in a direction perpendicular to the body of the control-side tab pieces 25 may be may be reduced or prevented, for example, by inserting the power-distribution-side tab pieces 14 in an alignment plate.

(10) Although the control-side tab pieces 25 and power-distribution-side tab pieces 14 are connected via the female relay terminals 30 in the above exemplary structure, the present invention is not limited to this and the control-side tab pieces 25 and power-distribution-side tab pieces 14 may be connected, for example, by welding.

(11) Although in the above exemplary structure, the control circuit board 21 is located at an end of the power distribution board 12 and extends on one side of the power distribution board 12, forming the letter L, the present invention is not limited to this and the control circuit board 21 may be disposed either above or below the power distribution board 12 perpendicularly to the body of the power distribution board 12.

(12) Although the power distribution board 12 and the control circuit board 21 are arranged perpendicular to each other in the above exemplary structure, the present invention is not limited to this and they may be arranged freely. For example, they may be arranged in the same plane, with their bodies being oriented in the same direction or they may be arranged vertically in two tiers with their bodies parallel to each other.

The invention claimed is:

1. An electrical junction box comprising:
   a housing, wherein the housing includes housing electrical components;
   a power distribution board composed of a first plurality of bus bars disposed along a first insulating substrate, wherein the power distribution board is positioned in the housing, and the power distribution board is connectable to the housing electrical components;
   a control circuit board installed in the housing in such a way as to be perpendicular to the power distribution board; the control circuit board including an electronic circuit constructed on a second insulating substrate;
   control circuit electrical components mounted on a first side of the control circuit board and controlled by the electronic circuit;
   a bus bar circuit including a second plurality of bus bars and bonded, via a first insulative bonding layer, to a second side of the control circuit board, wherein the second plurality of bus bars include tips bent perpendicular to a body of the control circuit board, and have tab pieces formed at the tips to connect to the power distribution board; and
   a heat dissipating portion which is bonded to a second insulative bonding layer, to dissipate heat from the control circuit board, wherein the second insulative bonding layer is bonded to the second side of the control circuit board.

2. The electrical junction box according to claim 1, wherein the first plurality of bus bars have tab pieces, and the tab pieces extend toward the control circuit board and are connected with the tab pieces of the second plurality of bus bars.

3. The electrical junction box according to claim 2, wherein the control circuit board includes a mounting surface on which the electrical components are mounted, the mounting surface faces the power distribution board, and the heat dissipating portion faces in a direction opposite to the power distribution board.

4. The electrical junction box according to claim 3, wherein the control circuit electrical components include ends, and the control circuit electrical components are positioned away from each other near ends of the control circuit board.

5. The electrical junction box according to claim 4, wherein the control circuit electrical components are semiconductor relays.

6. The electrical junction box according to claim 5, wherein the power distribution board includes ends, and the control circuit board is located at an end of the power distribution board and extends on one side of the power distribution board in the form of a L.

7. The electrical junction box according to claim 6, wherein an auxiliary housing is installed integrally with the housing, the auxiliary housing open on a side opposite to the power distribution board.

8. The electrical junction box according to claim 7, wherein the heat dissipating portion is a heat dissipating plate installed on the open side of the auxiliary housing.

9. The electrical junction box according to claim 8, wherein the housing electrical components are mountable onto front and rear faces of the power distribution board, and a height of the auxiliary housing in a direction orthogonal to the power distribution board is within a range equal to a width between a maximum height of the housing electrical components mounted on a front face of the housing and a maximum height of the housing electrical components mounted on a rear face of the housing.

10. The electrical junction box according to claim 1, wherein the control circuit board has a mounting surface on which the electrical components are mounted, the mounting surface faces the power distribution board, and the heat dissipating portion faces in a direction opposite to the power distribution board.

11. The electrical junction box according to claim 1, wherein the housing electrical components having ends are mounted on the control circuit board, and the housing electrical components are positioned away from each other near ends of the control circuit board.

12. The electrical junction box according to claim 1, wherein the control circuit electrical components are semiconductor relays.

13. The electrical junction box according to claim 1, wherein the power distribution board includes ends, and the control circuit board is located at an end of the power distribution board and extends on one side of the power distribution board, in the form of a L.

14. The electrical junction box according to claim 1, wherein an auxiliary housing is installed integrally with the housing, the auxiliary housing open on a side opposite to the power distribution board, and the control circuit board is positioned within the auxiliary housing.

15. The electrical junction box according to claim 14, wherein the heat dissipating portion is a heat dissipating plate installed on the open side of the auxiliary housing.

16. An electrical junction box comprising:
a housing, wherein the housing includes housing electrical components;
a power distribution board composed of a first plurality of bus bars disposed along a first insulating substrate, wherein the power distribution board is positioned in the housing, and the power distributing board is connectable to the housing electrical components;
a control circuit board installed in the housing in such a way as to be perpendicular to the power distribution board, the control circuit board including an electronic circuit constructed on a second insulating substrate,
control circuit electrical components mounted on a first side of the control circuit board and controlled by the electronic circuit;
a bus bar circuit including a second plurality of bus bars and bonded, via a first insulative bonding layer, to a second side of the control circuit board; and
a heat dissipating portion which is bonded to a second insulative bonding layer, to dissipate heat from the control circuit board, wherein
the second insulative bonding layer is bonded to the second side of the control circuit board,
an auxiliary housing is installed integrally with the housing, the auxiliary housing open on a side opposite to the power distribution board, and
the housing electrical components are mountable on front and rear faces of the power distribution board, and a height of the auxiliary housing in a direction orthogonal to the power distribution board within a range equal to a width between a maximum height of the housing electrical components mounted on a front face of the housing and a maximum height of the housing electrical components mounted on a rear face of the housing.

17. An electrical junction box comprising:
a housing, wherein the housing includes housing electrical components;
a power distribution board composed of a first plurality of bus bars disposed along a first insulating substrate, wherein the power distribution board is positioned in the housing, and the power distributing board is connectable to the housing electrical components;
a control circuit board installed in the housing in such a way as to be perpendicular to the power distribution board, the control circuit board including an electronic circuit constructed on a second insulating substrate;
control circuit electrical components mounted on a first side of the control circuit board and controlled by the electronic circuit;
a bus bar circuit including a second plurality of bus bars and bonded, via a first insulative bonding layer, to a second side of the control circuit board; and
a heat dissipating portion which is bonded to a second insulative bonding layer, to dissipate heat from the control circuit board, wherein
the second insulative bonding layer is bonded to the second side of the control circuit board,
an auxiliary housing is installed integrally with the housing, the auxiliary housing open on a side opposite to the power distribution board,
the heat dissipating portion is a heat dissipating plate installed on the open side of the auxiliary housing, and
the housing electrical components are mountable on front and rear faces of the power distribution board, and a height of the auxiliary housing in a direction orthogonal to the power distribution board within a range equal to a width between a maximum height of the housing electrical components mounted on a front face of the housing and a maximum height of the housing electrical components mounted on a rear face of the housing.

* * * * *